(12) United States Patent
Park

(10) Patent No.: US 7,499,367 B2
(45) Date of Patent: Mar. 3, 2009

(54) SEMICONDUCTOR MEMORY DEVICE HAVING STACKED BANK STRUCTURE

(75) Inventor: Nak Kyu Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/683,546

(22) Filed: Mar. 8, 2007

(65) Prior Publication Data
US 2008/0002478 A1    Jan. 3, 2008

(30) Foreign Application Priority Data
Jun. 30, 2006    (KR) ...................... 10-2006-0061283

(51) Int. Cl.
*G11C 8/00*    (2006.01)
(52) U.S. Cl. ............................ 365/230.06; 365/230.06; 365/193; 365/203
(58) Field of Classification Search ............ 365/230.06, 365/230.03, 193, 203
See application file for complete search history.

(56) References Cited
U.S. PATENT DOCUMENTS
6,741,513 B2    5/2004    Honigschmid et al.

2005/0157579 A1 *    7/2005    Perego et al. .......... 365/230.03

FOREIGN PATENT DOCUMENTS

| | | | |
|---|---|---|---|
| JP | 2003-007062 | | 1/2003 |
| KR | 1019970062043 | * | 11/1997 |
| KR | 100252050 | * | 1/2000 |
| KR | 1020010077494 | | 8/2001 |
| KR | 1020040105007 | | 12/2004 |
| KR | 1020060023200 | | 3/2006 |
| KR | 1020060027665 | | 3/2006 |

* cited by examiner

*Primary Examiner*—Hoai V Ho
*Assistant Examiner*—Fernando N Hidalgo
(74) *Attorney, Agent, or Firm*—Ladas & Parry LLP

(57) ABSTRACT

A semiconductor memory has a stacked bank structure and includes a data input/output pad; a global input/output line connected to the data input/output pad; and a plurality of banks connected to the global input/output line. Each bank is stacked on another one of the banks and shares a local input/output line corresponding to the global input/output line and a column select signal line to which a column select signal is applied. Accordingly, by providing a bank structure in which different banks are stacked, the number of global input/output lines, local input/output lines and write drivers (or input/output sense amps) are reduced.

22 Claims, 12 Drawing Sheets

SEMICONDUCTOR MEMORY DEVICE HAVING STACKED BANK STRUCTURE

CROSS-REFERENCE TO RELATED APPLICATIONS

The present application claims priority to Korean patent application number 10-2006-0061283 filed on Jun. 30, 2006, which is incorporated herein by reference in its entirety.

BACKGROUND OF THE INVENTION

The present invention relates to a semiconductor memory device, and more particularly to a semiconductor memory device with a stack bank structure.

A semiconductor memory device in general includes an array of separate memory cells. The array of memory cells includes a plurality of rows and columns, the cross points of which are defined as memory cell addresses. The memory cells include a capacitor that stores charges as well as a transistor that serves to change or sense the charges of the capacitor. The charges are expressed as data bit; for example, a high voltage as the logic "1", and a low voltage as the logic "0". The data is stored in the memory during write operations and read from the memory during read operations.

In the conventional semiconductor memory devices, read operations connect the memory cells to the bit lines after activating the relevant word line(s). When the word lines are activated, the sense amplifier (also referred to as "the sense amp") detects and amplifies data on activated bit lines. The semiconductor memory device selects the row and the column corresponding to the bit in order to access the memory cell. The sense amp determines whether "1" or "0" is stored in that memory position.

Meanwhile, a bank structure is adopted to reduce the capacitance load of the word line by reducing the length of the word line, thereby improving the access time and cycle time of the semiconductor memory device. That is, by disposing the memory cells of the semiconductor memory device in a bank unit, it is possible to form multiple bank structures that operate as the units of bank.

FIG. 1 is a schematic block structure of a semiconductor memory device with a conventional 4-bank structure.

Referring to FIG. 1, in the semiconductor memory device 100 of a 4-bank structure, one bank is divided into half-banks such that they are symmetrically aligned with the DQ pads DQ<0> to DQ<15>. One half-bank 110 includes of two core blocks 116, 118.

If one bank of the four banks, such as bank 0, is accessed, the half-bank 110 located above the DQ pads DQ<0>to DQ<15> sends/receives data to/from the DQ pads DQ<0> to DQ<7> through global input/output lines (GIO) 112, 114. The half-bank 120 under the DQ pads DQ<0> to DQ<15>sends/receives data to/from the DQ pads DQ<8> to DQ<15 through global input/output lines (GIO) 122, 124.

FIG. 2 is a block diagram showing the structure of a core block of the bank as illustrated in FIG. 1 supporting 4 bits prefetch. Referring to FIG. 2, the bank includes an even 0 block (EVEN0), an odd 0 block (ODD0), an even 1block (EVEN1) and an odd 1 block (ODD0).

The even 0 block (EVEN0), the odd 0 block (ODD0), the even 1 block (EVEN1), and the odd 1 block (ODD0) each includes a plurality of subblocks. The corresponding subblocks in each of the even 0 block (EVEN0), the odd 0block (ODD0), the even 1 block (EVEN1), and the odd 1 block (ODD0) form one mat. For example, the subblock 210 in the even 0 block (EVEN0), the subblock 220 of the odd 0 block (ODD0), the subblock 230 of the even 1 block (EVEN1) and the subblock 240 of the odd 1 block (ODD1) become a mat MAT<0>.

Each of the even 0 block (EVEN0), the odd 0 block (ODD0), the even 1 block (EVEN1), and the odd 1 block (ODD1) included in the core block is connected to four global input/output lines GIO through local input/output lines (LIO), a write driver (WDRV) (not shown), or input/output sense AMP (IOSA) 212, 222, 232, 242. Also, the even 0 block (EVEN0), the odd 0 block (ODD0), even 1block (EVEN1) and odd 1 block (ODD1) share the column select signal YI<0> to YI<n−1>.

In conventional bank structures supporting 4-bits prefetch, the DQ<0> pad sends/receives data to/from each of the memory blocks through the global input/output lines GIO_EV0<0>, GIO_EV1<0>, GIO_OD0<0>, and GIO_OD1<0>, and the DQ<1> pad sends/receives data to/from each memory block through the global input/output lines GIO_EV0<1>, GIO_EV1<1>, GIO_OD0<1>, and GIO_OD1<1>.

Further, the DQ<2> pad sends/receives data to/from each memory block through the global input/output lines GIO_EV0<2>, GIO_EV1<2>, IO_OD0<2>, and GIO_OD1<2>, and the DQ<3> pad sends/receives data to/from each memory block through the global input/output lines GIO_EV0<3>, GIO_EV1<3>, GIO_OD0<3>, and GIO_OD1<3>.

In the conventional bank structures supporting 4-bits prefetch, the write driver {WDRV} is enabled and the data on the global input/output line (GIO) is stored in the memory cell through the local input/output line LIO, a bit line sense amp (BLSA) unit 244 under the control of the subhole unit 246 in a case of writing the data. When reading the data stored in the memory cell, the data is delivered to the input/output sense amp 242 through the bit line sense amp unit 244, the local input/output line and the like under the control of the subhole unit 246, subsequently amplified and then recorded on the global input/output line.

FIG. 3 is a block structure diagram of the subhole unit (such as 246) and the bit line sense amp unit (such as 244) of FIG. 2, and FIG. 4 is a timing diagram for explaining operation of a semiconductor memory device with a conventional 4-bank structure. Referring to FIG. 3 and FIG. 4, active operations for banks 0 and 4 and read operations for banks 0 and 4 of the semiconductor memory device having the conventional 4-banks structure will be described now.

First, before the active operation proceeds, the bit line sense amp 340 equalizes the bit lines BL, /BL to a precharge level.

A mat control unit 310 outputs a bit line equalize signal BLEQ_M<n>_B<i> which is enabled "high" to the precharge unit 350. The precharge unit 350 turns on to allow the segment input/output lines SIO, /SIO to equalize to the precharge level of the bit line. Also, the mat control unit 310 outputs an input/output line connection signal BS_IO_M<n>_B<i> which is disabled "low" to an input/output connecting unit 370. The input/output connecting unit 370 is turned on to allow the segment input/output lines SIO, /SIO to disconnect from the local input/output lines LIO, /LIO.

A local input/output line reset signal generating unit 320 outputs a local input/output line reset signal LIO_RST_M<n>_B<i> which is enabled "high" to the reset unit 360. The reset unit 360 is turned on, thereby allowing the equalization of the local input/output lines LIO and /LIO to the precharge level of the local input/output line. Also, a column address decoder unit 330 outputs a column select signal YI<0:n−1>_B<i> that disables the bit line sense amp 340. The address signal outputted turns off the column select gate 342 of the bit line sense amp unit 340.

Next, the input of an active command ACT0 for the bank enables an internal active command signal RACT_B<0>. The bit line sense amp 340 of the mat selected by the row address GAX<0:xn> amplifies the data stored in the memory cell. At this time, the mat control unit 310 decreases the level of the bit line equalize signal BLEQ_M<0>_B<0> to "low" such that it stops equalizing the segment input/output lines SIO and /SIO. Also, the mat control unit 310 decreases the level of the input/output line connection signal BS_IO_M<0>_B<0> to "high" such that the segment input/output lines SIO and /SIO can connect to the local input/output lines LIO and /LIO respectively, thereby allowing the amplified data to move.

Next, input of the read command READ0 for the bank 0 from outside enables the internal column address select (CAS) command signal CAS_B<0>. The column address decoder unit 330 enables the column select signal YI<0>_B<0>corresponding to the column address GAY<0:yn> by synchronizing with the read/write strobe pulse RDWTSTBP.

Then, the bit line sense amp 340 delivers the amplified data on the bit lines BL and BL/ to the segment input/output lines SIO and /SIO. The data delivered to the segment input/output lines SIO and /SIO is inputted into the input/output sense amp (not shown) through the local input/output lines LIO and /LIO, amplified by the input/output sense amp and recorded on the global input/output line.

At this time, the mat control unit 310 outputs the local input/output line reset signal LIO_RST_M<0>_B<0>, of a "low" state, to the reset unit 360 while the column select signal YI<0>_B<0> is being enabled. The reset unit 360 is turned off to stop equalizing the local input/output lines LIO and /LIO. Therefore, the data of the segment lines SIO and /SIO can be moved in a stable manner to the local input/output lines LIO and /LIO. The active and read operations for bank 4 are the same as the active and read operations for bank 0.

Meanwhile, if the write command is inputted after the corresponding bank and row are activated, the corresponding write driver WDRV is enabled to cause the data on the global input/output lines to be recorded on each of the corresponding local input/output lines. The input/output connection signal of the mat selected when accessing the row is enabled to cause the data on the local input/output line to be delivered to the segment input/output line. The data on the segment input/output line is delivered to the bit line sense amp, which is enabled by the column select signal. The bit line sense amp amplifies the data delivered and stores it in the memory cell connected to the bit lines BL and /BL.

FIG. 5 is a schematic block structure diagram of the semiconductor memory device with an 8-bank stack structure 400 indicative of the prior art, which illustrates a semiconductor memory device with 16 DQ pads.

Referring to FIG. 5, in the semiconductor memory device with a conventional 8-bank stack structure, the eight banks are divided into half-banks, and two 4-banks are each located up and down with respect to the DQ pads DQ<0> to DQ<15>. One half-bank includes two core blocks. That is, one half-bank, e.g., down bank 410 includes of two core blocks 416, 418, and another half-bank, e.g., up bank 420 includes of two core blocks 426, 428.

If one of the eight banks is accessed, such as bank 0, the down bank 410 sends/receives the data to/from the DQ pads DQ<0> to DQ<7> through global input/output lines (GIO) 412, 414, and the up bank 420 stacked above the down bank 410 sends/receives the data to/from the DQ pads DQ<8> to DQ<15> through global input/output lines (GIO) 417, 419.

Such 8-bank stack structures are able to share the column select signal since the down bank 410 and the up bank 420 of bank 0 are stacked. However, since two half-banks 410, 420 are stacked up or down with respect to the DQ pads, the number of the global lines connecting each bank with the 16 DQ pads also increases. That is, the number of global input/output lines doubles compared to those of the bank structure of FIG. 1. Also, an up/down bank control logic (UP_DN CONTROL) is necessary to access all banks arranged in both directions with respect to the DQ pads.

The number of local input/output lines, write drivers and input/output sense amps that correspond to the global input/output lines also doubles. Referring to FIG. 6, it is apparent that as the number of global input/output lines increases in stacked banks, the number of local input/output lines, write drivers and input/output sense amps also increases.

SUMMARY OF TIRE INVENTION

The present invention is designed to address these and other problems and to provide a bank structure with different banks being stacked.

The present invention provides a bank structure that operates only the selected bit line sense amp despite the stacked structure of the different banks.

The present invention also provides a bank structure that is allowed to operate only the selected input/output connecting unit despite the stacked structure of the different banks.

In order to achieve the above-described advantages, the present invention provides a semiconductor memory device with a stack bank structure, comprising a data input/output pad; a global input/output line that is connected to the data input/output pad; and a plurality of banks that are connected to the global input/output line, the plurality of banks being stacked and sharing a local input/output line corresponding to the global input/output line and a column select signal line to which a column select signal is applied.

Preferably, the bank comprises two half-banks, and the half-banks are arranged symmetrically with respect to the data input/output pad.

Preferably, the bank is divided into $2^n$ (n=natural number) blocks that share one column select signal for the supporting $2^n$ data prefetches.

Preferably, the global input/output line comprises $2^n$ sublines, and the sublines input/output $2^n$ (n=natural number) prefetched data to/from the data input/output pad.

Further, the n is 4, and the four blocks are an EVEN 0 block, an ODD 0 block, an EVEN 1 block, and an ODD 1block.

Further, the bank is connected to the bit line and the segment input/output line, and comprises a bit line sense amp unit for connecting the bit line to the segment input/output line in response to a control signal and a subhole unit that generates the control signal, which drives the bit line sense amp unit and connects the segment input/output line to the local input/output line.

Further, the control signal comprises a column select control signal and a column select signal.

Further, the bit line sense amp unit comprises a switching unit, located between the bit line and the segment input/output line, for switching to connect the bit line with the segment input/output line; and a plurality of bit line sense amps including a column selecting unit that generates the control signal of the switching unit in response to the column select signal and the column select control signal.

Further, the plurality of bit line sense amps share the column select signal.

Further, the switching unit comprises MOS transistors that are turned on or off by the control signal of the switching unit.

Further, the column select unit enables the control signal of the switching unit to be outputted to the switching unit when the column select signal and the column select control signal are enabled.

Further, the column select unit comprises a PMOS transistor and a MOS transistor.

Further, the drains of the PMOS and NMOS transistors are connected to each other in order to serve as an output terminal that outputs the control signal of the switching unit. The gates of the PMOS and NMOS transistors are also connected to each other to serve as an input terminal to which the column select signal is applied, the column select control signal is applied to the source of the PMOS transistor, and the ground voltage is applied to the source of the NMOS transistor.

Further, the subhole unit comprises a mat control unit for generating a bit line equalize signal, an input/output line connection signal, and the column select control signal in response to a row active signal, a row address signal and an internal CAS command signal; and a column address decoding unit for generating the column select signal in response to the column address signal and the internal CAS command.

Further, the bit line equalize signal comprises bank and mat information selected by the row address, and the internal CAS command signal comprises bank information selected by the column address signal.

Further, the mat control unit comprises a NAND gate that NANDs an inverted signal of the bit line equalize signal and the internal CAS command signal and an inverter that inverts the output signal of the NAND gate to output it as the column select control signal.

Further, the subhole unit further comprises a local input/output line reset generating unit for generating the local input/output line reset signal in response to the bit line equalize signal and the internal CAS command signal.

Further, the subhole unit further comprises a local input/output line reset unit that equalizes the local input/output line to the precharge level of the local input/output line in response to the local input/output line reset signal.

Further, the local input/output line reset unit comprises a MOS transistor, which equalizes the local input/output line in response to the local input/output line reset signal.

Further, the subhole unit further comprises a segment input/output line precharge unit, which equalizes the local input/output line to a precharge level of the bit line in response to the bit line equalize signal.

Further, the subhole unit further comprises an input/output line connecting unit, which connects the segment input/output line with the local input/output line in response to the input/output line connection signal.

Further, the input/output line connection signal comprises bank and mat information selected by the row address and bank information selected by the column address.

Further, the input/output line connecting unit comprises a MOS transistor, located between the segment input/output line and the local input/output line, for switching to connect the segment input/output line with the local input/output line in response to the input/output line connection signal.

DESCRIPTION OF SPECIFIC EMBODIMENTS

Hereinafter, preferred embodiments of the present invention will be described with more particularity with references to the accompanying figures.

Figure 1:
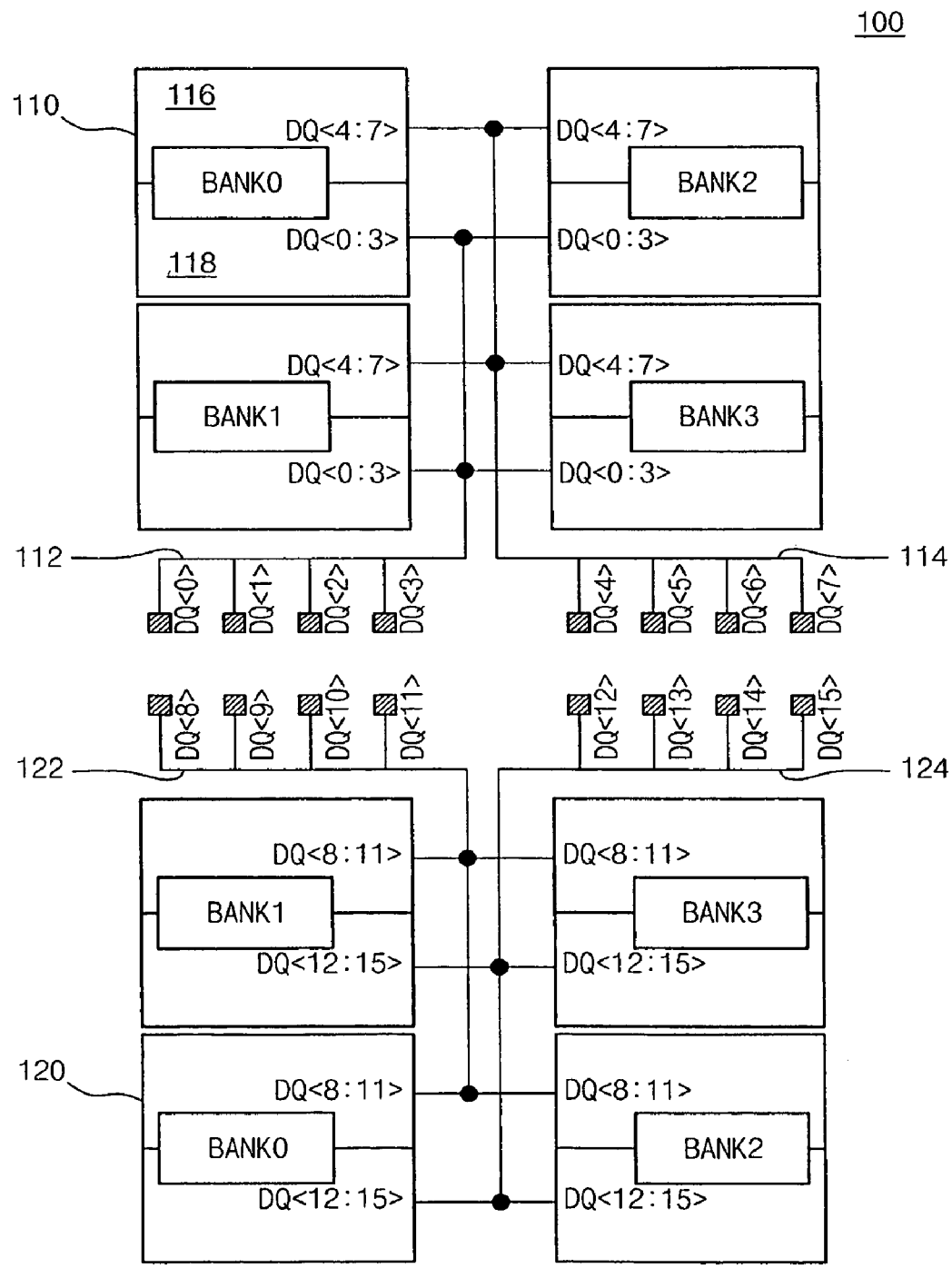
FIG. 1 is a schematic block structure diagram of the semiconductor memory device with a 4-bank structure.
Figure 2:
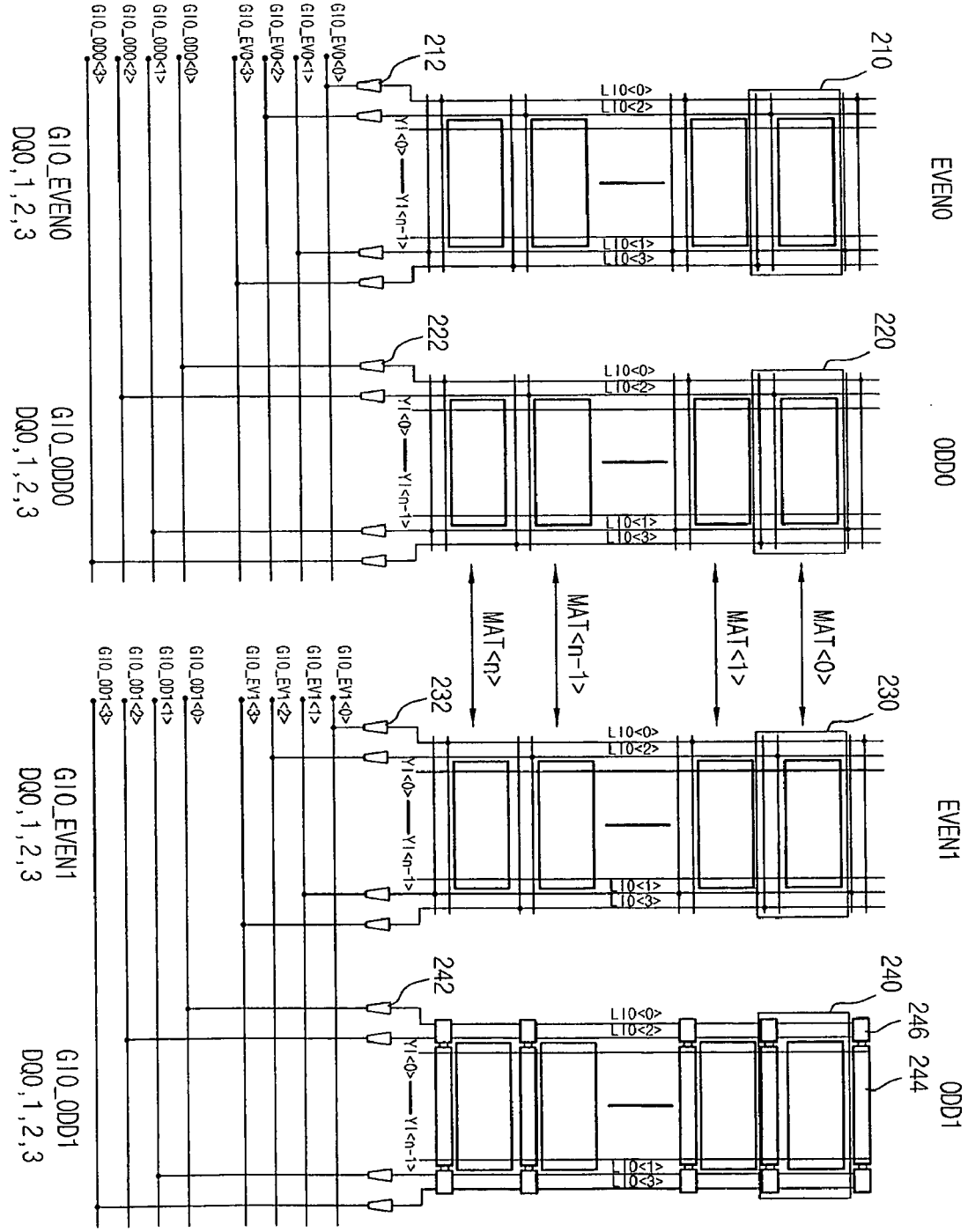
FIG. 2 is a core block structure diagram of the bank of FIG. 1.
Figure 3:
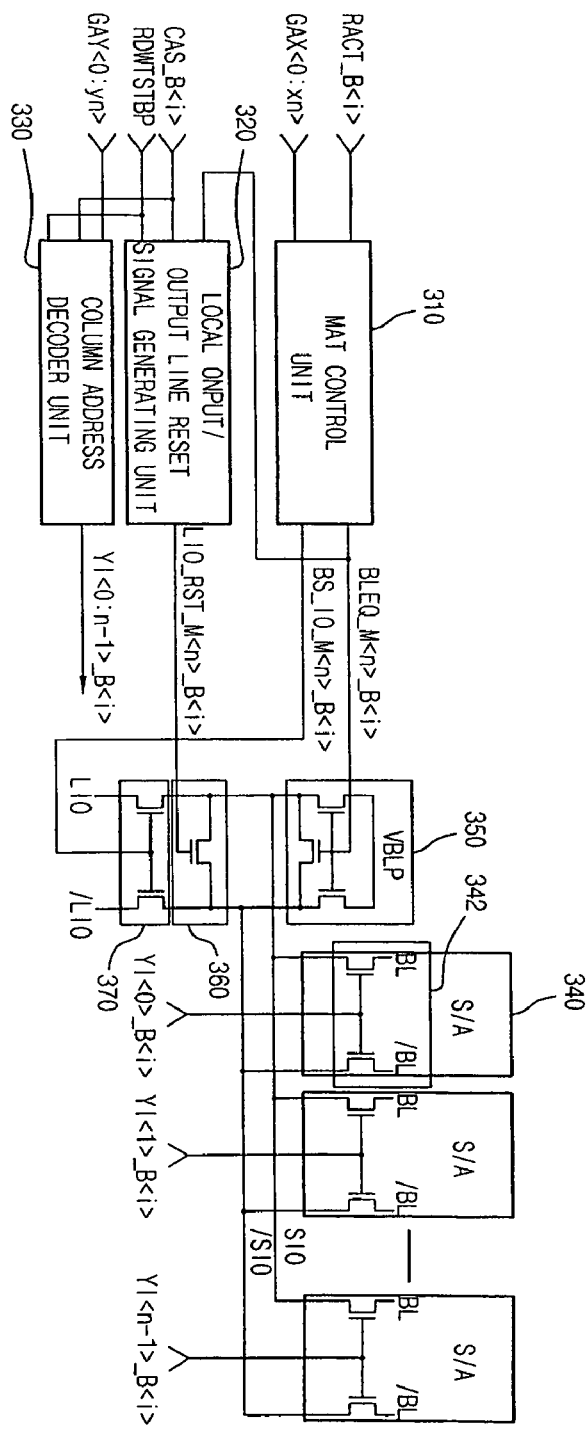
FIG. 3 is a block structure diagram of the subhole unit and the bit line sense amp unit of FIG. 2.
Figure 4:
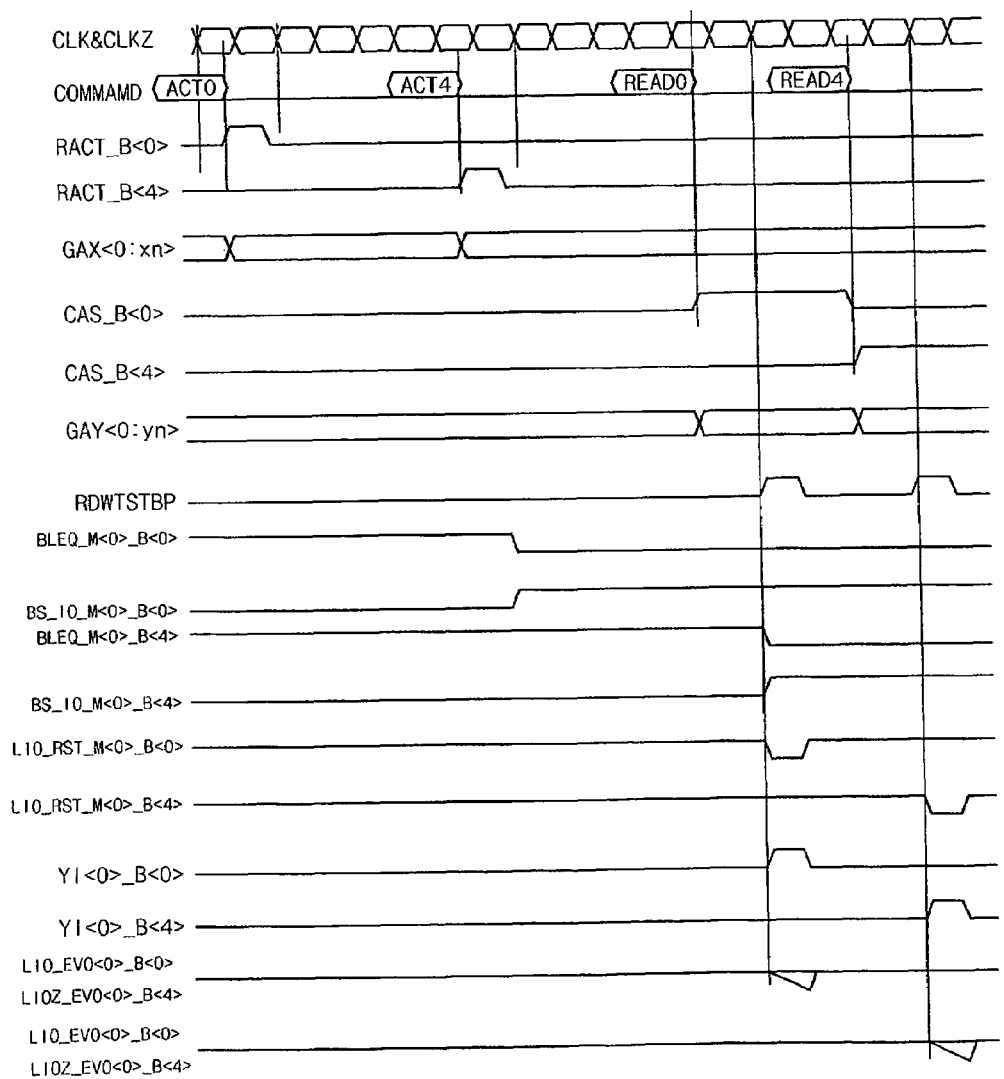
FIG. 4 is a timing diagram for explaining operations of the semiconductor memory device with the 4-bank structure of FIG. 1.
Figure 5:
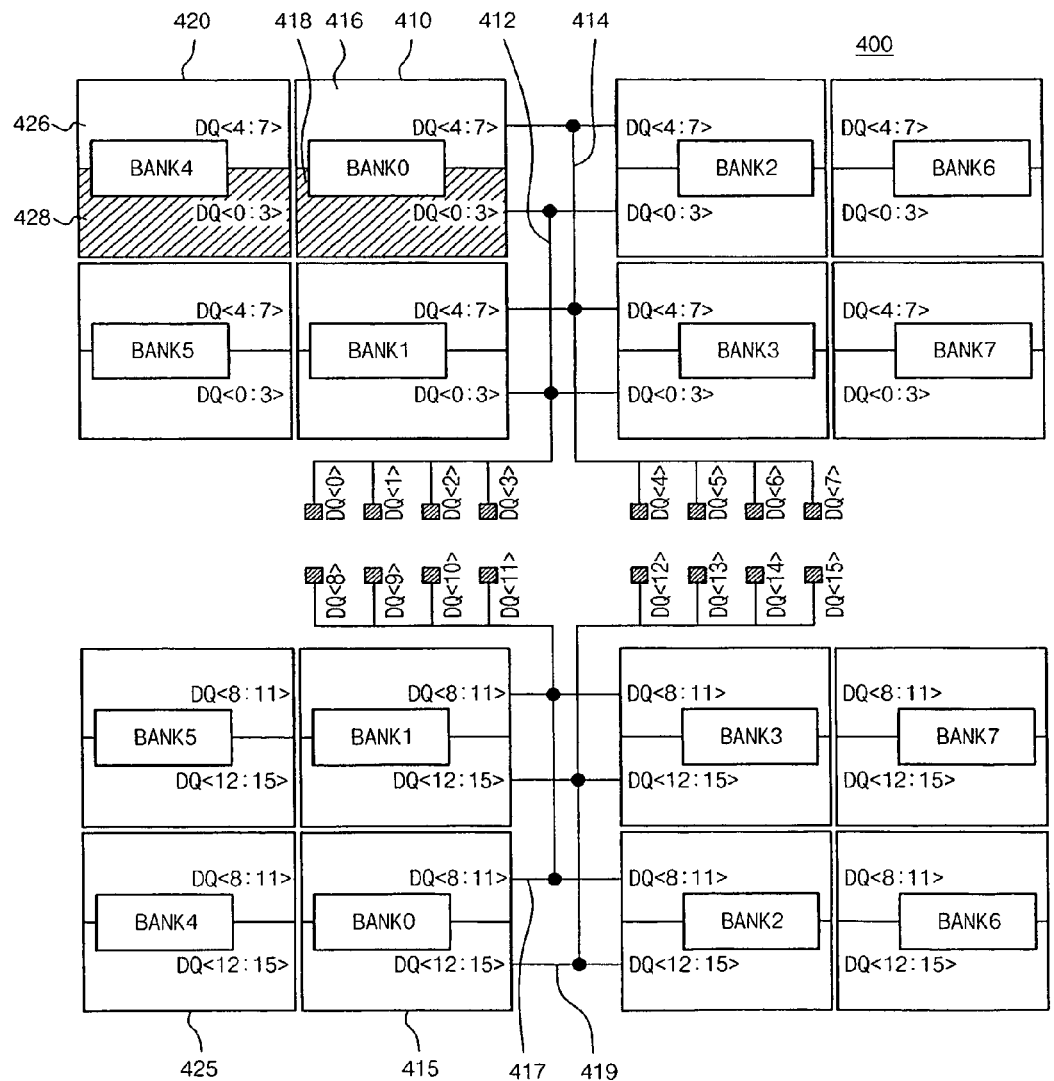
FIG. 5 is a schematic block structure diagram of the semiconductor memory device with an 8-bank stack structure.
Figure 6:
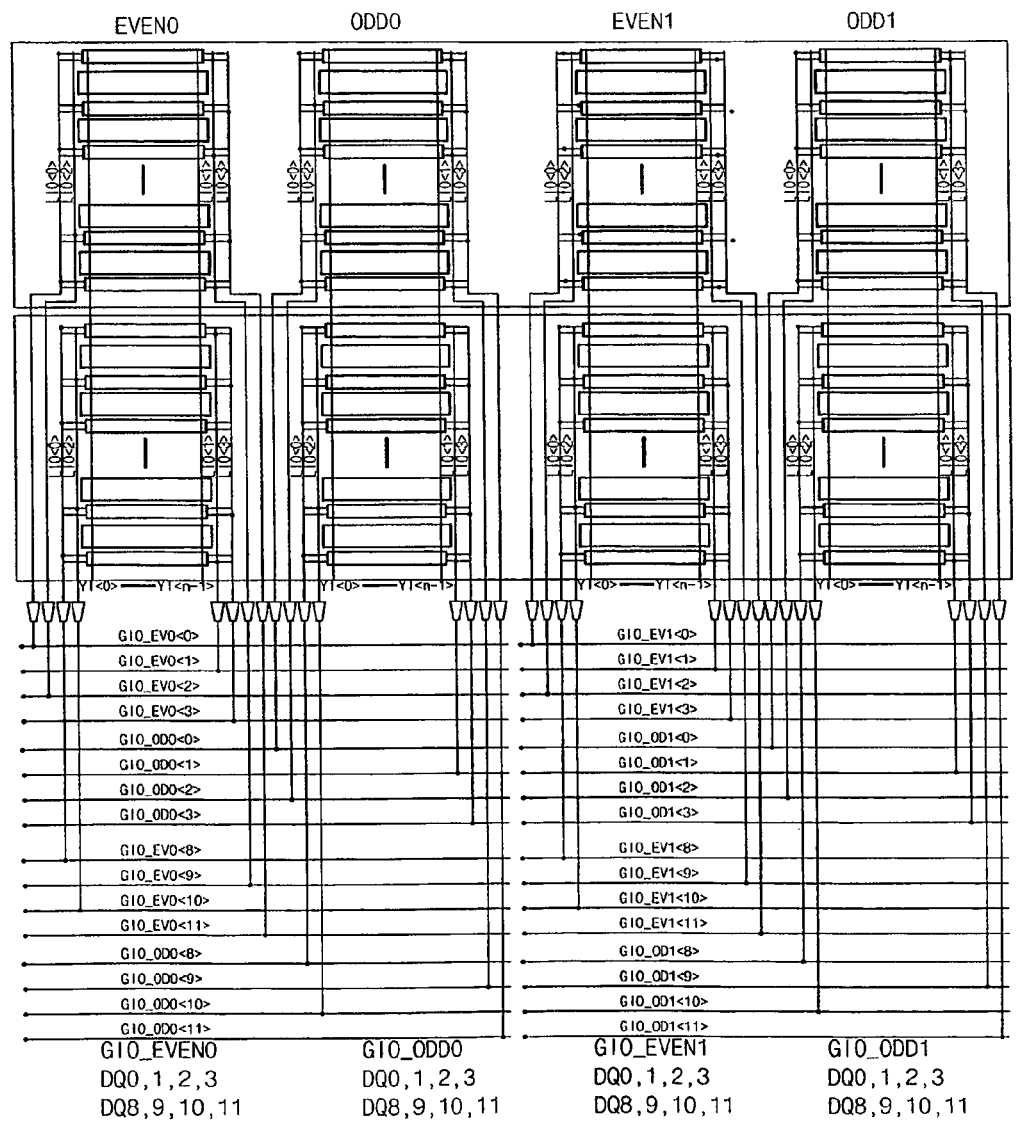
FIG. 6 is a core block structure diagram of the bank of FIG. 5.
Figure 7:
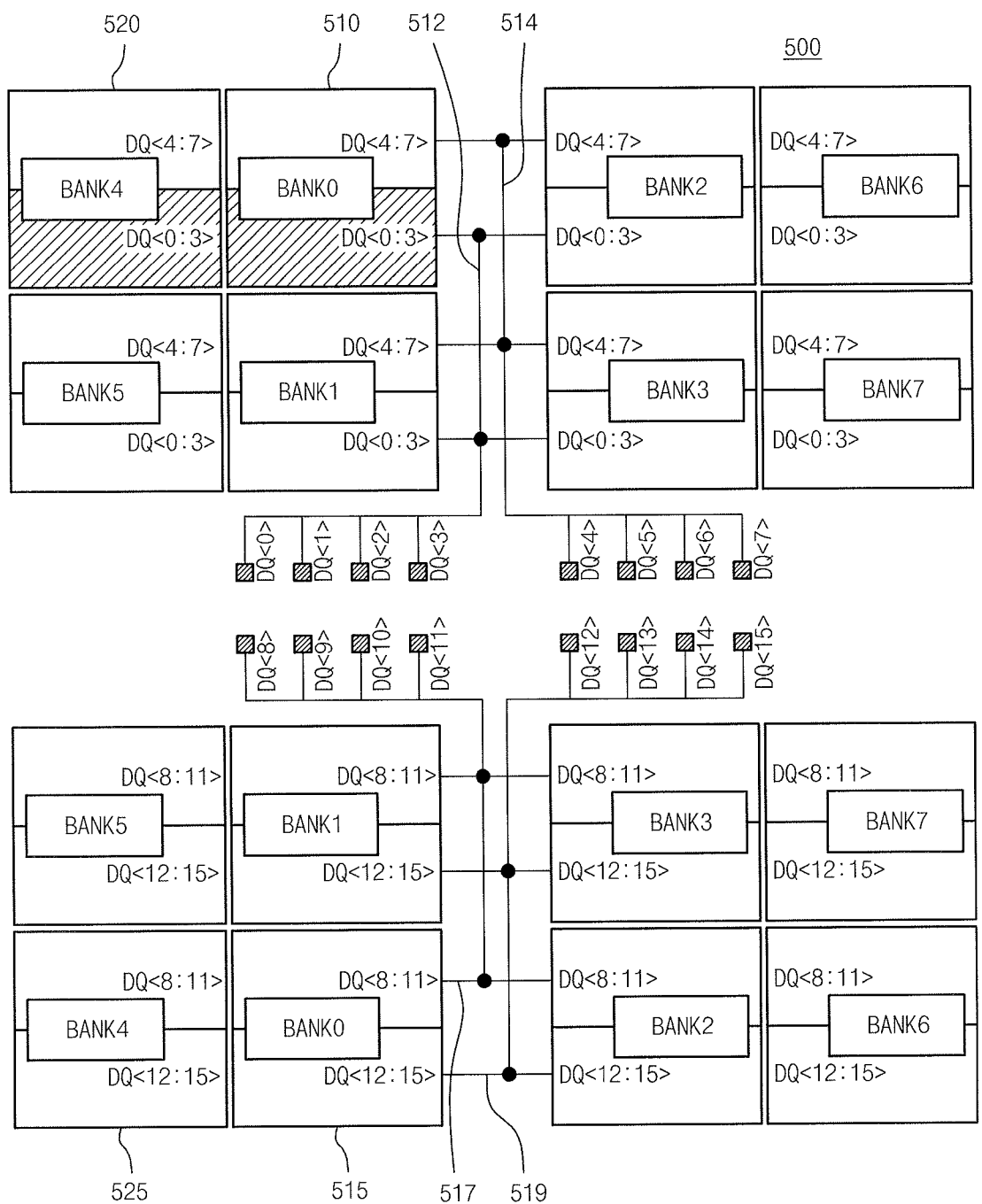
FIG. 7 is a schematic block structure diagram of the semiconductor memory device with an 8-bank stack structure according to one embodiment of the present invention.

FIG. 7 is a schematic block structure diagram of a semiconductor memory device with an 8-bank stack structure 500 according to an embodiment of the present invention. As shown in FIG. 7, the semiconductor memory device with an 8-bank stack structure 500 according to one embodiment of the present invention is structured such that every two banks of the eight banks are stacked to share the global input/output line. And each of the banks is divided into half-banks such that the banks are arranged symmetrically with respect to the DQ pads DQ<0> to DQ<15>.

More specifically, bank 0 and bank 4 are stacked, bank 1 and bank 5 are stacked, bank 2 and bank 6 are stacked, and bank 3 and bank 7 are stacked such that different banks may share the global input/output line. For example, the half-bank 510 of bank 0 located up and down with respect to the DQ pads DQ<0> to DQ<15> shares the global input/output line 512 of GIO_EV0<0:3>, GIO_OD0<0:3>, GIO_EV1<0:3> and GIO_OD1<0:3> and the global input/output line 514 of GIO_EV0<4:7>, GIO_OD0<4:7>, GIO_EV1<4:7> and GIO_OD1<4:7> with the half-bank 520 of bank 4.

Further, the half-bank 515 of bank 0 located down with respect to the DQ pads DQ<0> to DQ<15> shares the global input/output line 517 of GIO_EV0<8:11>, GIO_OD0<8:11>, GIO_EV1<8:11> and GIO_OD1<8:11> and the global input/output line 519 of GIO_EV0<12:15>, GIO_OD0<12:15>, GIO_EV1<12:15> and GIO_OD1<12:15> with the half-bank 525 of bank 4. Each of the eight banks sends/receives the data to/from the DQ pad <0:15> through the global input/output lines of GIO_EV0<0:15>, GIO_OD0<0:15>, GIO_EV1<0:15> and GIO_OD1<0:15>.

Figure 8:
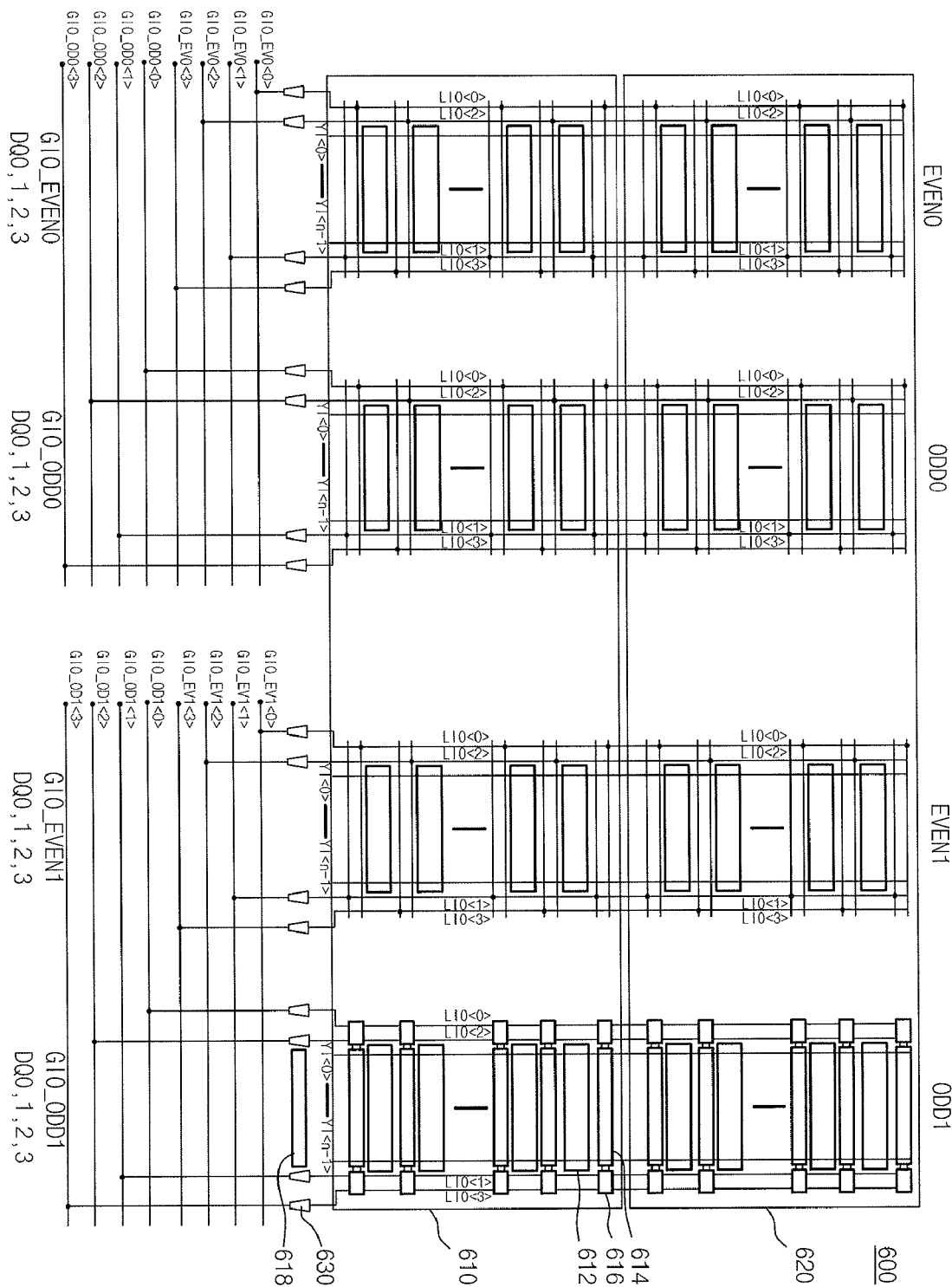
FIG. 8 is a core block structure diagram of the stacked banks of FIG. 7.

FIG. 8 is a core block diagram supporting 4 bits prefetch, which shows core blocks (e.g., the slanted line portions in the banks 0 and 4 in FIG. 7) to which the half-banks of bank 0 and the half-bank of bank 4 are stacked. As shown in FIG. 8, the core block 610 of bank 0 and the core block 620 of bank 4 may share the global input/output lines GIO_EV0<0:3>, GIO_OD0<0:3>, GIO_EV1<0:3> and GIO_OD1<0:3>.

Also, it shares the local input/output lines LIO, /LIO and the write driver (or the input/output sense amp) 630 corresponding to the global input/output line. The core block 610 includes a memory cell array unit 612, a bit line sense amp unit 614, and a subhole unit 616 and is connected to the column address decoder unit 618, which generates column select signal /YI<0:n−1>. Two different banks, i.e., bank 0 610 and bank 4 620, share the column select signal line.

In the 8-bank stack structure according to one embodiment of the present invention, since one bank is divided into two half-banks and arranged up and down with respect to the DQ pads respectively, the number of global input/output lines connected to the DQ pad is reduced by one-half compared to prior art. The number of local input/output lines and write drivers (or input/output sense amps) corresponding to the global input/output lines is also reduced by one-half, and up/down bank control logic is not necessary to access the banks arranged in both directions with respect to the DQ pads.

However, if the semiconductor memory device with an 8-bank stack structure according to one embodiment of the present invention is controlled by the subhole unit and the bit line sense amp unit according to prior art, the read or write operations may not occur correctly if two different stacked banks are simultaneously activated. For example, when enabling corresponding column select signal YI in order to read the data on the memory cell of bank 4 under the condition that bank 0 and bank 4 are both activated, the bit line sense amp of bank 0, sharing the column select signal line, amplifies the signal on the bit line and delivers it to the segment input/output line. The input/output connection signal is enabled, thereby causing the local input/output line to connect to the segment input/output line. That is, if bank 0 and bank 4 are both activated, the shared local input/output line is often connected to the segment input/output line of bank 0 and bank 4 such that the corresponding memory cell data of bank 4 and bank 0 may collide with each other.

Also, if the corresponding column select signal is enabled in order to write the data onto the memory cell of bank 4 where bank 0 and bank 4 are stacked, invalid data is written onto the corresponding memory cell of bank 4 and bank 0.

If bank 0 is activated and the column select signal YI is enabled, bank 4 is therefore activated and the input/output connection signal is enabled while the data is delivered to the local input/output line, the segment input/output line (bit line precharge level) of bank 4 and the local input/output line of bank 0 (carrying read data) are connected such that valid data may not be delivered normally.

Next, an embodiment of the present invention will be described in which it is possible to achieve a normal read or write operation despite the simultaneous activation of two stacked banks in the 8-bank stacked structure.

Figure 9:
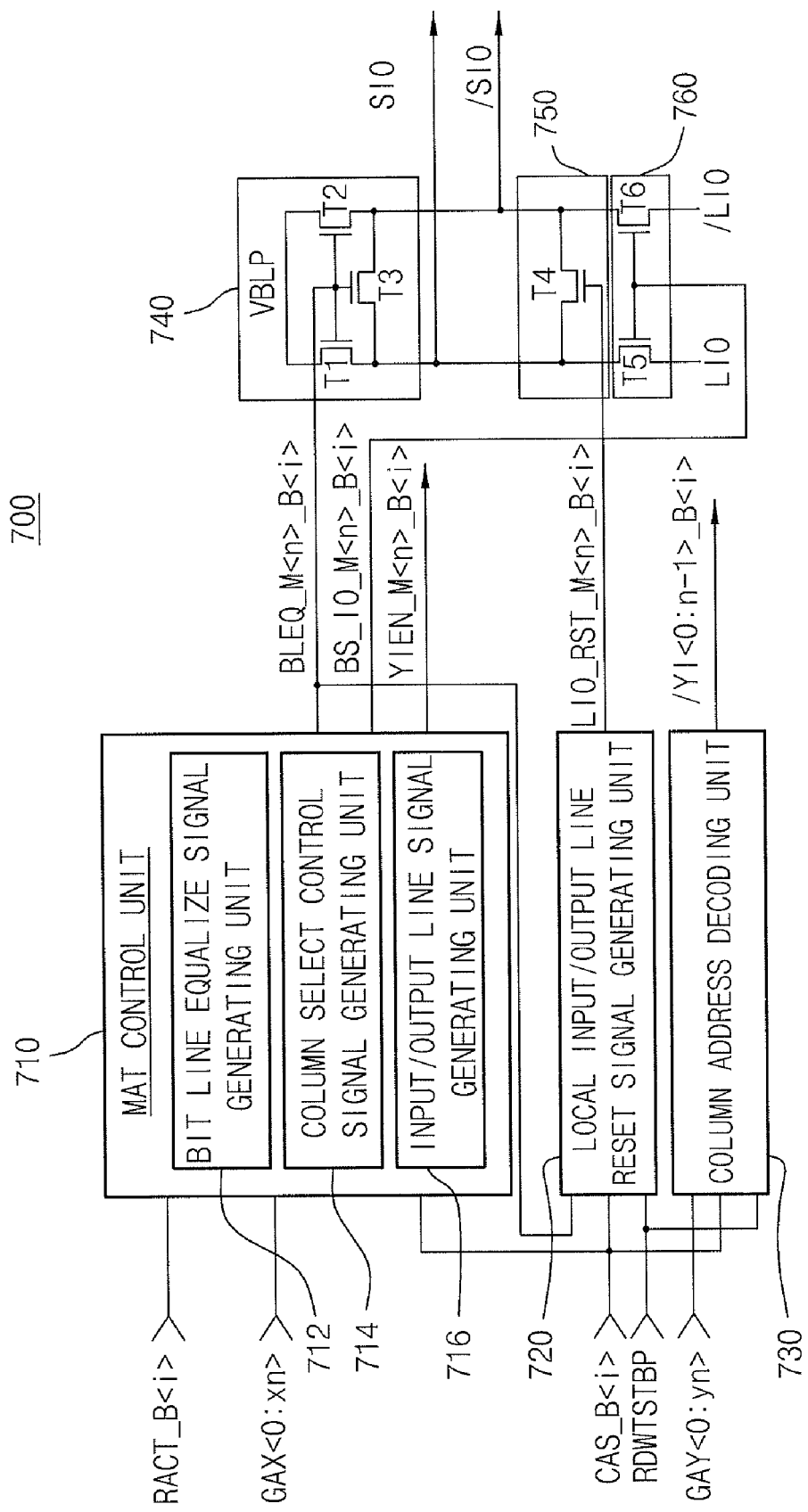
FIG. 9 is a structure diagram of the subhole unit of FIG. 8.

FIG. 9 is a structure block diagram of the subhole unit (such as 616 shown in FIG. 8) of a semiconductor memory device according to one embodiment of the present invention. As shown in FIG. 9, the subhole unit 700 of a semiconductor memory device according to one embodiment of the present invention includes a mat control unit 710, a local input/output line reset signal generating unit 720, a column address decoding unit 730, segment input/output line precharge unit 740, a local input/output line reset unit 750, and an input/output line connecting unit 760.

The mat control unit 710 inputs a row active signal RACT_B<i>, a row address signal GAX<0:xn>, and an internal CAS command signal CAS_B<i> and generates a bit line equalize signal BLEQ_M<n>_B<i>, an input/output line connection signal BS_IO_M<n>_B<i> and a column select control signal YIEN_M<n>_B<i>. The mat control unit 710 includes a bit line equalize signal generating unit 712, a column select control signal generating unit 714 and an input/output line connection signal generating unit 716. The column select control signal generating unit 714 and the input/output line connection signal generating unit 716 will be more specifically described with references to to FIGS. 10 11. The description of the bit line equalize signal generating unit 712 is omitted since it is well known to those skilled in the art.

Here, the bit line equalize signal BLEQ_M<n>_B<i>operates the local input/output line precharge unit 740 to cause the segment input/output lines SIO and /SIO to be equalized to the precharge level of the bit line. The input/output line connection signal LIO_RST_M<n>_B<i>operates the input/output line connecting unit 760 to cause the segment input/output lines SIO and /SIO to connect with the local input/output lines LIO and /LIO. The column select control signal YIEN_M<n>_B<i> selects and operates one bit line sense amp from amongst the bit line sense amps connected to the column select signal line /YI<0:n−1>_B<i>.

The local input/output line reset signal generating unit 720 inputs the bit line equalize signal BLEQ_M<n>_B<i>, the internal command signal CAS_B<i> and the read/write strobe signal RDWTSTBP and generates the local input/output line reset signal LIO_RST_M<n>_B<i>.

The column address decoding unit 730 inputs the internal command signal CAS_B<i>, the read/write strobe signal RDWTSTBP and the column address signal GAY<0:yn> and generates the column select signal /YI<0:n−1>_B<i>. Here, the column select signal /YI<0:n−1>_B<i> reverses the phase of conventional column select signal YI.

The segment input/output line precharge unit 740 causes the local input/output line LIO and /LIO to be equalized to the precharge level of the bit line in response to the bit line equalize signal BLEQ. The segment input/output line precharge unit 740 is connected to the segment input/output lines SIO and /SIO respectively, and includes two MOS transistors T1, T2 for switching the application of the bit line precharge voltage VBLP in response to the bit line equalize signal BLEQ_M<n>_B<i> and a MOS transistor T3 for equalizing the segment input/output lines SIO and /SIO in response to the bit line equalize signal BLEQ_M<n>_B<i>.

The local input/output line reset unit 750 equalizes the local input/output lines LIO and /LIO to the local input/output line precharge level in response to the local input/output reset signal LIO_RST_M<n>_B<i>. The local input/output line reset unit 750 includes a MOS transistor T4 which is connected to the local input/output lines LIO and /LIO line for equalizing the local input/output lines LIO and /LIO in response to the local input/output line reset signal LIO_RST_M<n>_B<i>.

The input/output line connecting unit 760 connects the input/output lines SIO and /SIO to the local input/output lines LIO and /LIO in response to the input/output line connection signal BS_IO_M<n>_B<i>. The input/output line connecting unit 760 includes MOS transistors T5, T6, which are located between the segment input/output line SIO and the local input/output line LIO and between the segment input/output line /SIO and the local input/output line /LIO respectively, for switching to connect the segment input/output lines SIO and /SIO with the local input/output line LIO and /LIO in response to the input/output connection signal BS_IO_M<n>_B<i>.

Figure 10:
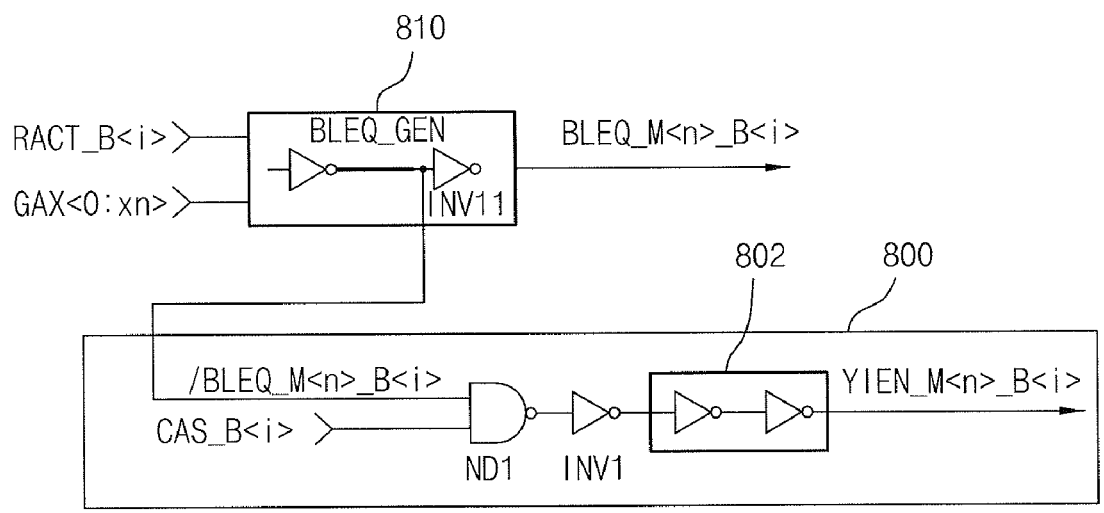
FIG. 10 is an exemplified circuit diagram of the column select control signal generating unit of FIG. 9.

FIG. 10 is an exemplified circuit diagram of the column select control signal generating unit of FIG. 9. As shown in FIG. 10, the column select control signal generating unit 800 according to one embodiment of the present invention includes a NAND gate ND1, which NANDs the inverted signal /BLEQ_M<n>_B<i> of the bit line equalize signal BLEQ_M<n>_B<i> and the internal CAS command signal CAS_B<i>, and an inverter INV1, which inverts the output signal of the NAND gate ND1 and outputs it as a column select control signal YIEN_M<n>_B<I>. Here, the bit line equalize signal BLEQ_M<n>_B<i> includes bank and mat information selected by the row address GAX_<o:xn>. The internal CAS command signal CAS_B<i> also includes bank information selected for write and read operations.

Such a column select control signal generating unit 800 can generate the column select control signal YIEN_M<n>_B<i>, which is enabled in the section where the corresponding bank is activated in order to stop equalizing the segment input/output lines SIO and /SIO, and the internal CAS command signal CAS_B<i> for the corresponding bank is enabled for write or read operation. Therefore, the column select control signal YIEN_M<n>_B<i> can be used as a signal that operates only the bit line sense amp of the bank selected for write or read operations among the bit line sense amps of bank 0 and the bit line sense amps of bank 4.

The column select control signal generating unit 800 further includes a delay unit 802 for adjusting the delay degree of the signal outputted from the inverter INV1. The delay unit 802 can consist of an even number of inverters that input and output the output signal of the inverter INV1.

The reference number 810 refers to a bit line equalize signal generating unit, which inputs the row active signal RACT_B<i> and row address GAX<0:xn>, and outputs the bit line equalize signal BLEQ_M<n>_B<i>. Therefore, the bit line equalize signal generating unit 810 provides the input signal of the inverter INV11, which outputs the bit line equalize signal BLEQ_M<n>_B<i> to the column select control signal generating unit 800.

Figure 11:
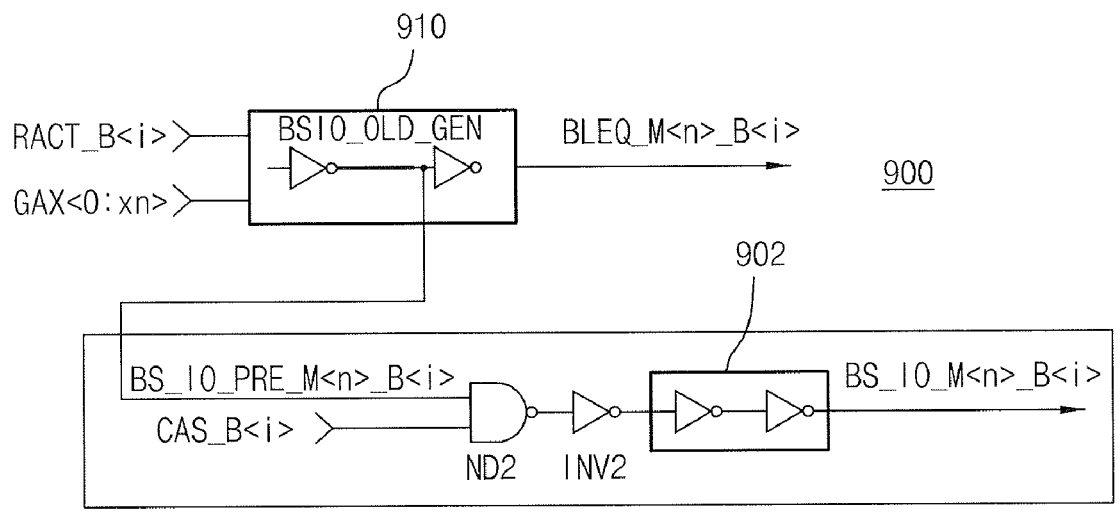
FIG. 11 is an exemplified circuit diagram of the input/output line connection signal generating unit.

FIG. 11 is an exemplified circuit diagram of the input/output line connection signal generating unit of FIG. 9. As shown in FIG. 11, the input/output line connection signal generating unit 900 according to one embodiment of the present invention includes a NAND gate ND2, which NANDs the previous input/output line connection signal BS_IO_PRE_M<n>_B<i> and the internal CAS command signal CAS_B<i>, and an inverter INV2, which inverts the output signal of the NAND gate ND2 and outputs it to the input/output line connection signal BS_IO_M<n>_B<i>.

Preferably, the input/output line connection signal generating unit 900 further includes a previous input/output line connection signal generating unit 910 for generating the previous input/output line connection signal BS_IO_PRE_M<n>_B<i>. The detailed description of the previous input/output line connection signal generating unit 910 is omitted since it is well known to those skilled in the art.

The input/output line connection signal BS_IO_M<n>_B<i> includes bank and mat information selected by the row address GAX<0:xn>. The internal CAS command signal CAS_B<i> includes bank information selected for write or read operations.

Such a input/output line connection signal generating unit 900 can generate the input/output line connection signal BS_IO_M<n>_B<i>, which is enabled in a section where the previous input/output line connection signal BS_IO_PRE_M<n>_B<i> is enabled and the internal CAS command signal CAS_B<i> for the corresponding bank is enabled for write or read operations. Therefore, the input/output line connection signal BS_IO_M<n>_B<i> is used as a signal that operates only the input/output line connecting unit of the bank selected for write or read operations after it is activated.

The input/output line connection signal generating unit 900 further can include a delay unit 902 for adjusting the delay degree of the signal outputted from the inverter INV2. The delay unit 902 includes of an even number of inverters that input the output signal of the inverter INV2 and output it.

Figure 12:
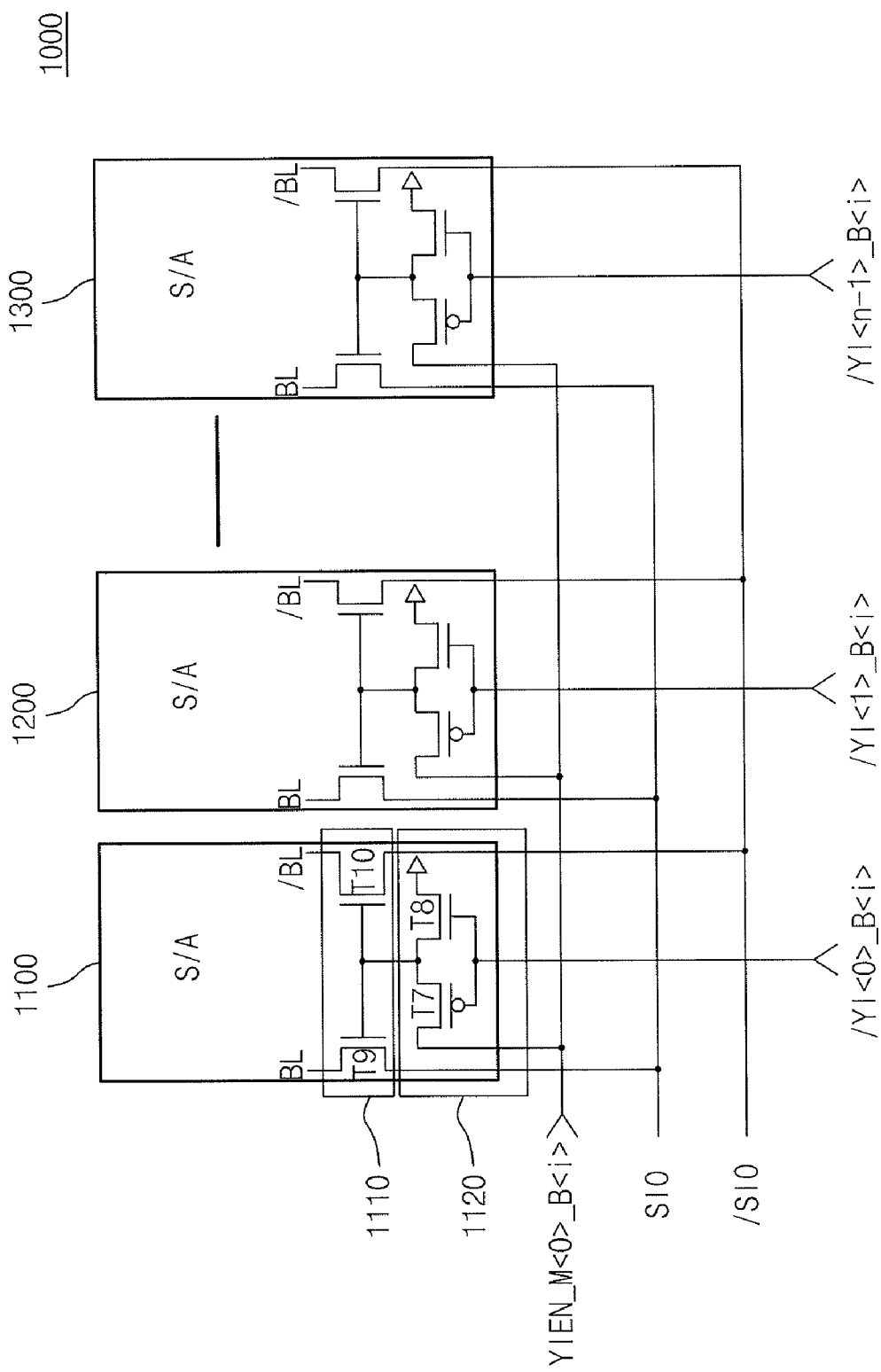
FIG. 12 is an exemplified circuit diagram of the bit line sense amp unit of FIG. 8.

FIG. 12 is a block structure diagram of the bit line sense amp according to one embodiment of the present invention. As shown in FIG. 12, the bit line sense amp unit 1000 according to one embodiment of the present invention includes a plurality of bit line sense amps 1100, 1200, 1300 for amplifying the data signal of the bit lines BL, /BL and connects the bit lines BL and /BL to the segment input/output lines SIO and /SIO to deliver the amplified data signal to the segment input/output line SIO and/SIO in response to the column select signal /YI<0:n-1>_B<i> and the column select control signal YIEN_M<n>_B<i>.

For the purpose of it, the bit line sense amp 1100 according to one embodiment of the present invention includes a switching unit 1110, which is located between the bit line BL and the segment input/output line SIO and between the bit line /BL and the segment input/output lines /SIO respectively, for connecting the bit lines BL and /BL to the segment input/output lines SIO and /SIO and a column select unit 1120 for generating the switching unit control signal in response to the column select signal /YI<0:n-1>_B<i> and the column select control signal YIEN_M<n>_B<i>. Here, the column select signal /YI<0:n-1>_B<i> is an inverted signal of the previous column select signal. Since the previous column select signal is well known to those skilled in the art and the column select signal /YI<0:n-1>_B<i> can be easily generated from the previous column select signal, a detailed description of the column select signal /YI<0:n-1>_B<i> is omitted.

The switching unit 1110 preferably includes of MOS transistors T9, T10, which are turned on or off by the control signal of the switching unit.

The column selecting unit 1120 includes of one PMOS transistor T7 and one NMOS transistor T8. The drains of the PMOS transistor T7 and NMOS transistor T8 are connected to each other to serve as an output terminal from which the switching unit control signal is outputted. The gates of the PMOS transistor T7 and NMOS transistor T8 are connected to each other. The column select signal /YI<0:n-1>_B<i> is applied to the gates of the PMOS transistor T7 and NMOS transistor T8. The column select control signal YIEN_M<n>_B<i> is applied to the source of the PMOS transistor T7. The ground voltage is applied to the source of the NMOS transistor T8.

Since such a bit line sense amp unit 1000 connects the bit lines BL and /BL to the segment input/output lines SIO and /SIO in response to the column select signal /YI<0:n-1>_B<i> and the column select control signal YIEN_M<n>_B<i>, other bit line sense amps that share the column select signal line /YI<0:n-1>_B<i> do not operate. Therefore, if the memory device of an 8-bank stack structure according to one embodiment of the present invention is controlled by the subhole unit and the bit line sense amp unit according to one embodiment of the present invention, it is possible to perform read or write operations for a desired bank.

Figure 13:
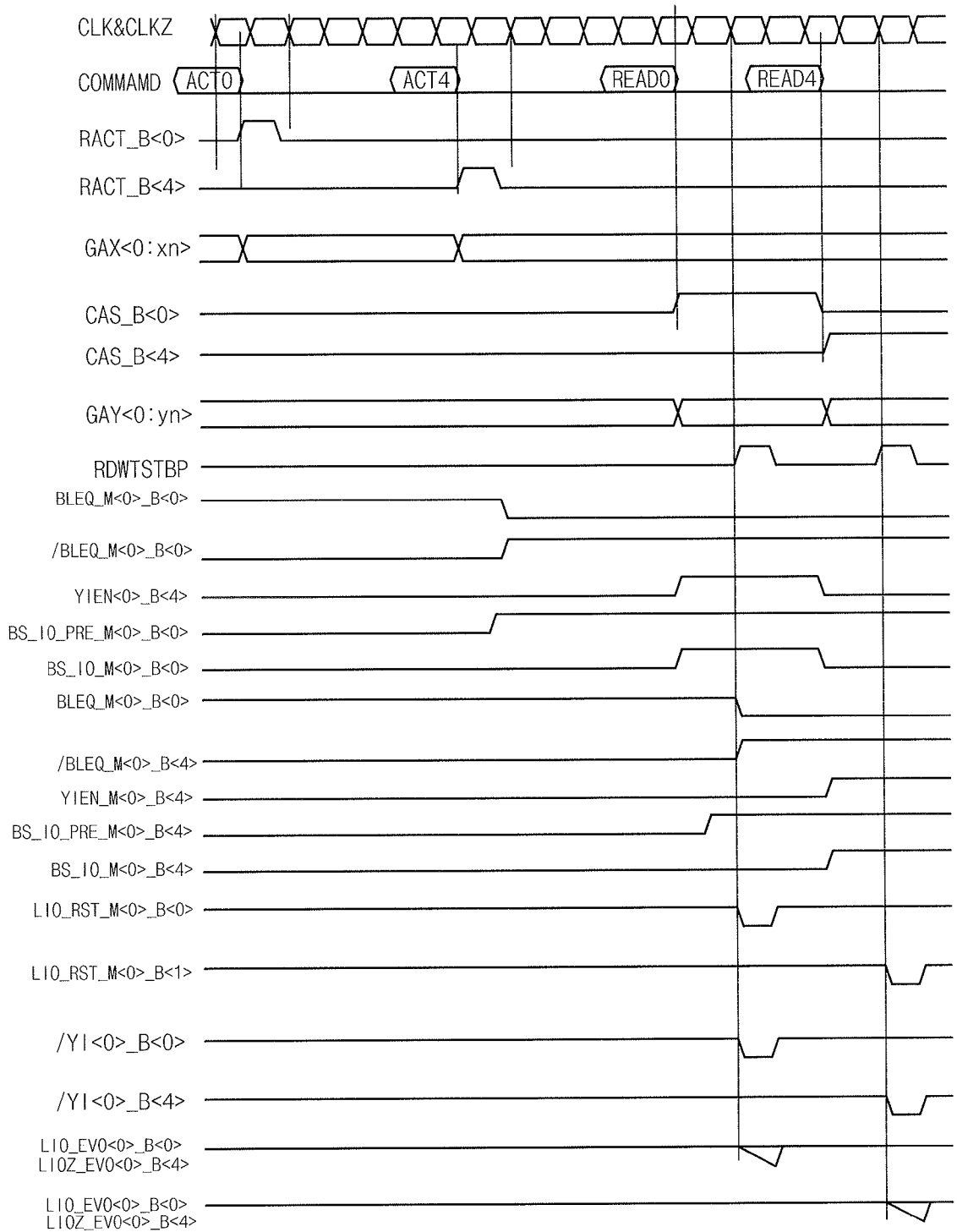
FIG. 13 is a timing diagram for explaining the operation of the semiconductor memory device with the 8-bank stack structure of FIG. 7.

FIG. 13 is a timing diagram for explaining the operation of the semiconductor memory device with the 8-bank stack structure of FIG. 7 under the control of the subhole unit and the bit line sense amp according to one embodiment of the present invention.

Referring to FIG. 13, the semiconductor memory device with the 8-bank stack structure according to one embodiment of the present invention will be described by exemplifying a case in which the external read commands READ0 and READ4 are inputted consecutively and internal CAS commands CAS_B<0>, CAS_B<4> corresponding to the column address GAY<0:yn> are enabled after external active commands ACT0, ACT4 activate the rows of bank 0 and bank 4 corresponding to row address GAX<0:xn>.

Here, bank 0 and bank 4 are stacked to share the column select signal line, the local input/output line and the global input/output line. As a reference, in the timing diagram of FIG. 13, a signal represented by a solid line is associated with bank 0 and a signal represented by a dotted line is associated with bank 4.

The semiconductor memory device with the 8-bank stack structure according to one embodiment of the present invention can read data correctly even though a read operation is performed for two stacked banks while both banks are simultaneously activated.

According to one embodiment of the present invention, the bit line sense amp corresponding to mat 0 of bank 0 amongst the bit line sense amps delivers the data signal of the bit lines BL, /BL to the segment input/output lines SIO and /SIO when the column select control signal YIEN_M<0>_B<0> is "high" and the column select control signal /YI<0>_B<0> is "low". At this time, the local input/output line reset-signal LIO_RST_M<0>_B<0> to be disabled allows for easy delivery of the data.

The column select control-signal YIEN_M<0>_B<0> is enabled in a common section where the inverted bit line equalize signal /BLEQ_M<0>_B<0> and the internal CAS command signal CAS_B<0> are "high".

Therefore, other bit line sense amps that share the column select signal line, for example the bit line sense amp of bank 4, do not operate. That is, the column select control-signal YIEN_M<0>_B<4> is "low" during a section where the column select control signal YIEN_M<0>_B<0> is "high".

Therefore, the local input/output line of bank 0 records the normally amplified data signals LIO_M<0>_B<0>, /LIO_M<0>_B<0>, and an abnormal data signal is not recorded on the local input/output line of bank 4. That is, it is possible to read the data correctly even when two banks simultaneously activated.

Further, the input/output line connecting unit corresponding to mat 0 of bank 0 among the input/output line connecting units connects the segment input/output lines SIO and /SIO with the local input/output lines LIO and /LIO when the input/output line connection signal BS_IO_M<0>_B<0> is "high". The input/output line connection signal BS_IO_M<0>_B<0> is enabled in a common section where the previous input/output line connection signal BS_IO_PRE_M<0>_B<0>, including bank information, mat information and the internal CAS command signal CAS_B<0>, are "high".

Therefore, other input/output line connecting units that share the local input/output line in common, for example, the input/output line connecting unit of bank 4, do not operate. That is, the local input/output line connection signal BS_IO_M<0> is "low" during a section where the local input/output line connection signal BS_IO_M<0>_B<0> is "high".

Therefore, data on the local input/output line does not collide even though the read operation for bank 0 and bank 4 is performed when both bank 0 and bank 4 are simultaneously activated.

The descriptions of the read operations and signal for bank 4 are omitted, since it can be inferred from the descriptions of the read operations and signal for the bank 0.

As explained, the semiconductor memory device with a stack bank structure according to the present invention reduces the number of global input/output lines, local input/output lines, and write drivers (or input/output sense amps) by providing a bank structure in which different banks are stacked.

Further, the present invention allows the stacked banks to share the column select signal line by only operating the selected bit line sense amp even when different banks are stacked.

Further, the stacked banks share the global input/output line and the local input/output line by operating only the selected input/output connecting unit even when different banks are stacked.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor memory device with stack bank structure, comprising:
   a data input/output pad;
   a global input/output line connected to the data input/output pad; and
   a plurality of banks connected to the global input/output line, wherein each of the plurality of banks is stacked on another, and where the plurality of banks share a local input/output line corresponding to the global input/output line and a column select signal line to which a column select signal is applied,
   wherein each bank comprises two half-banks,
   wherein the bank is divided into $2^n$ (where n is a natural number) blocks that share one column select signal for supporting $2^n$ data prefetches.

2. The semiconductor memory device of claim 1, wherein the global input/output line comprises $2^n$ sublines.

3. The semiconductor memory device of claim 2, wherein the sublines input/output $2^n$ (where n is a natural number) prefetched data to/from the data input/output pad.

4. The semiconductor memory device of claim 2, wherein the n is 4.

5. The semiconductor memory device of claim 4, wherein the 4 blocks are an EVEN 0 block, an ODD 0 block, an EVEN 1 block, and an ODD 1 block.

6. The semiconductor memory device of claim 1, wherein the half-banks are arranged symmetrically with respect to the data input/output pad.

7. A semiconductor memory device with stack bank structure, comprising:
   a data input/output pad;
   a global input/output line connected to the data input/output pad; and
   a plurality of banks connected to the global input/output line, wherein each of the plurality of banks is stacked on another, and where the plurality of banks share a local input/output line corresponding to the global input/output line and a column select signal line to which a column select signal is applied
   wherein each bank is connected to a bit line and a segment input/output line, and each bank comprises:
      a bit line sense amp unit connecting the bit line to the segment input/output line in response to a control signal; and
      a subhole unit generating the control signal which drives the bit line sense amp unit and connects the segment input/output line with the local input/output line, wherein the control signal comprises a column select control signal and the column select signal, and
wherein the bit line sense amp unit comprises:
 a switching unit located between the bit line and the segment input/output line for switching to connect the bit line with the segment input/output line; and
 a plurality of bit line sense amps including a column selecting unit that generates a control signal of the switching unit in response to the column select signal and the column select control signal.

8. The semiconductor memory device of claim 7, wherein the plurality of bit line sense amps shares the column select signal.

9. The semiconductor memory device of claim 7, wherein the switching unit comprises MOS transistors that are turned on or off by the control signal of the switching unit.

10. The semiconductor memory device of claim 9, wherein the column select unit enables the control signal of the switching unit to be outputted to the switching unit when the column select signal and the column select control signal are enabled.

11. The semiconductor memory device of claim 10, wherein the column select unit comprises a PMOS transistor and a MOS transistor.

12. The semiconductor memory device of claim 11, wherein the drain of the PMOS transistor and the drain of the NMOS transistor are connected to each other to serve as an output terminal that outputs the control signal of the switching unit, wherein the gate of the PMOS transistor and the gate of the NMOS transistor are connected to each other to serve as an input terminal to which the column select signal is applied, wherein the column select control signal is applied to the source of the PMOS transistor, and wherein the ground voltage is applied to the source of the NMOS transistor.

13. A semiconductor memory device with stack bank structure, comprising:
 a data input/output pad;
 a global input/output line connected to the data input/output pad; and
 a plurality of banks connected to the global input/output line, wherein each of the plurality of banks is stacked on another, and where the plurality of banks share a local input/output line corresponding to the global input/output line and a column select signal line to which a column select signal is applied
 wherein each bank is connected to a bit line and a segment input/output line, and each bank comprises:
  a bit line sense amp unit connecting the bit line to the segment input/output line in response to a control signal; and
  a subhole unit generating the control signal which drives the bit line sense amp unit and connects the segment input/output line with the local input/output line,
 wherein the control signal comprises a column select control signal and the column select signal, and
 wherein the subhole unit comprises:
  a mat control unit for generating a bit line equalize signal, an input/output line connection signal, and the column select control signal in response to a row active signal, a row address signal and an internal CAS command signal; and
  a column address decoding unit for generating the column select signal in response to a column address signal and the internal CAS command.

14. The semiconductor memory device of claim 13, wherein the bit line equalize signal comprises bank and mat information selected by a row address, and wherein the internal CAS command signal comprises bank information selected by the column address signal.

15. The semiconductor memory device of claim 14, wherein the mat control unit comprises:
 a NAND gate performing a NAND logical operation on an inverted signal of the bit line equalize signal and the internal CAS command signal; and
 an inverter that inverts the output signal of the NAND gate for outputting as the column select control signal.

16. The semiconductor memory device of claim 13, wherein the subhole unit further comprises a local input/output line reset generating unit generating the local input/output line reset signal in response to the bit line equalize signal and the internal CAS command signal.

17. The semiconductor memory device of claim 16, wherein the subhole unit further comprises a local input/output line reset unit equalizing the local input/output line to a precharge level of the local input/output line in response to the local input/output line reset signal.

18. The semiconductor memory device of claim 17, wherein the local input/output line reset unit comprises a MOS transistor equalizing the local input/output line in response to the local input/output line reset signal.

19. The semiconductor memory device of claim 13, wherein the subhole unit further comprises a segment input/output line precharge unit equalizing the local input/output line to a precharge level of the bit line in response to the bit line equalize signal.

20. The semiconductor memory device of claim 13, wherein the subhole unit further comprises an input/output line connecting unit for connecting the segment input/output line with the local input/output line in response to the input/output line connection signal.

21. The semiconductor memory device of claim 20, wherein the input/output line connection signal comprises:
 bank and mat information selected by the row address; and
 bank information selected by the column address.

22. The semiconductor memory device of claim 21, wherein the input/output line connecting unit comprises a MOS transistor located between the segment input/output line and the local input/output line for switching to connect the segment input/output line with the local input/output line in response to the input/output line connection signal.

* * * * *